United States Patent

McNicol et al.

[11] Patent Number: 6,091,298
[45] Date of Patent: Jul. 18, 2000

[54] LINEAR AMPLIFIER ARRANGEMENT

[75] Inventors: John Duncan McNicol, Brixham, United Kingdom; David Neal Wessel, Woodlawn, Canada

[73] Assignee: Nortel Networks Corporation, Montreal, Canada

[21] Appl. No.: 09/140,934

[22] Filed: Aug. 27, 1998

[51] Int. Cl.[7] .................................................. H03F 1/32
[52] U.S. Cl. ......................... 330/149; 330/136; 330/107
[58] Field of Search .................................... 330/107, 129, 330/136, 149

[56] References Cited

U.S. PATENT DOCUMENTS

| | | | |
|---|---|---|---|
| 4,885,551 | 12/1989 | Myer . | |
| 5,101,172 | 3/1992 | Ikeda et al. | 330/136 |
| 5,101,173 | 3/1992 | DiPiazza et al. | 330/136 |
| 5,182,524 | 1/1993 | Hopkins | 330/149 |
| 5,742,201 | 4/1998 | Eisenberg et al. | 330/149 X |
| 5,770,971 | 6/1998 | McNicol . | |

FOREIGN PATENT DOCUMENTS

WO97/24798  7/1997  WIPO .

OTHER PUBLICATIONS

Highly Efficient Broadband Linearisation of RF Amplifiers for Satellite and Cellular Applications—Kieran John Parsons—Mar. 1996.

*Primary Examiner*—Steven J. Mottola
*Attorney, Agent, or Firm*—Lee, Mann, Smith, McWilliams, Sweeney & Ohlson

[57] ABSTRACT

This invention relates to high power linear amplifiers. A high power linear amplifier is disclosed for communications such as CDMA communication systems. Linear amplifiers as used in communication systems exhibit a linear characteristic where the amplifiers output power increases relative to an input power. After a certain input level, known as a gain saturation point, the amplifier then exhibits non-linear characteristics; the output power increases relatively little with respect to power input. This non-linear region is also known as the saturation region or the gain compression region. In accordance with the invention, there is provided a power amplifier comprising a power amplifier, a feedback circuit and a control element;

wherein the feedback circuit receives a sample of the input signal delayed in time and employs phase and amplitude components of both the input signal delayed in time and a feedback signal derived from the output of the power amplifier to drive a control element, which control element determines the signal input to the amplifier whereby the power amplifier can produce an improved linear output.

13 Claims, 8 Drawing Sheets

LINEAR AMPLIFIER ARRANGEMENT

FIELD OF THE INVENTION

This invention relates to high power linear amplifiers and in particular relates to the same for communication systems.

BACKGROUND OF THE INVENTION

Linear amplifiers as used in communication systems exhibit a linear characteristic where the amplifiers output power increases relative to an input power. After a certain input level, known as a gain saturation point, the amplifier then exhibits non-linear characteristics; the output power increases relatively little with respect to power input. This non-linear region is also known as the saturation region or the gain compression region.

In systems such as Code Division Multiple Access (CDMA) modulation schemes, a pluralit of signals are transmitted in a communication system and are amplified simultaneously. When a plurality of signals are applied to a linear amplifier, its non-linear characteristics will tend to produce interaction between the signals being amplified and the amplifier output will contain intermodulation products. Such intermodulation products reduce signal quality by allowing cross-talk to occur and such spillage often falls outside a particular licensed spectrum and must be controlled. Such intermodulation distortion can be reduced by negative feedback of the distortion components, pre-distortion of the signal to be amplified to cancel the amplifier generated distortion, or by separating the distortion components with the amplifier output and feeding forward the distortion component to cancel the distortion of the amplifier output signal. Feed forward is more complicated in that it requires the modification of the separated distortion component in amplitude and phase to match the gain and phase shift of the amplifier on a continuous basis.

WO97/24798 (Qualcomm) provides an out-of-band compensation system for a non-linear device. A signal source provided in the system provides an out-of-band signal, which out-of-band signal combines with a second signal derived from a non-constant envelope signal. The combined signal combines with the nonconstant envelope signal which is input to a nonlinear power amplifier. No feedback is employed; the power of the combined signal is maintained at a nominal operating point. U.S. PAT. NO. 4,885,551 (American Telephone and Telegraph Company) provides a feed forward linear amplifier. An input signal is applied to first and second paths one of which has a distortion component. The signals of the first and second circuits are combined to form a signal representative of the distortion component of the first circuit path whereby distortion can be cancelled. This complicated circuit however can be both difficult and expensive to produce.

OBJECT OF THE INVENTION

The present invention seeks to provide an improved linear amplifier arrangement. More particularly the present invention seeks to provide a linear amplifier arrangement capable of amplifying and combining a number of frequency carriers or bearers.

SUMMARY OF THE INVENTION

In accordance with a first aspect of the invention, there is provided a linear power amplifier comprising a power amplifier, a feedback circuit and a control element; wherein the feedback circuit receives a sample of the input signal delayed in time and employs phase and amplitude components of both the input signal delayed in time and a feedback signal derived from the output of the power amplifier to drive a control element, which control element determines the signal input to the amplifier whereby the power amplifier can produce an improved linear output.

In accordance with a second aspect of the invention, there is provided a linear power amplifier arrangement comprising an input line, a power amplifier, an output line, an input tap and an output tap, first and second mixers, and a feedback circuit comprising a delay element, a first splitter, a second splitter, a phase control circuit and an amplitude control circuit, wherein, in use: the input tap obtains a portion of the input signal, which portion is delayed. by delay element and split into phase and amplitude components; the output tap obtains a portion of the input signal from the high power amplifier as part of the feedback circuit which signal is split into phase and amplitude components; whereby: the delayed input signal phase component is combined with the feedback phase component by the phase control circuit to produce a phase correction signal which is multiplied by the first multiplier, and; whereby the delayed input signal amplitude component is combined with the feedback amplitude component by the amplitude control circuit to produce an amplitude correction signal which is multiplied by the second multiplier; whereby the amplifier outputs an improved linear signal.

In accordance with a third aspect of the invention, there is provided a method of operating a linear power amplifier arrangement comprising an input line, a power amplifier, an output line, an input tap and an output tap, first and second mixers, and a feedback circuit comprising a delay element, a first splitter, a second splitter, a phase control circuit and an amplitude control circuit, the method comprising the steps of: obtaining a portion of the input signal by means of the input tap, delaying said portion is by a delay element and splitting the signal portion into phase and amplitude components; tapping off a feedback signal using the output tap to obtain a portion of the output signal from the high power amplifier and splitting the feedback signal into phase and amplitude components; combining the delayed input signal phase component with the feedback phase component by the phase control circuit to produce a phase correction signal which is multiplied with the first multiplier, and combining the delayed input signal amplitude component with the feedback amplitude component by the amplitude control circuit to produce an amplitude correction signal which is multiplied with the second multiplier; whereby, in operation, the amplifier has an improved linear output signal.

In accordance with a fourth aspect of the invention, there is provided a method of operating a linear power amplifier arrangement comprising a power amplifier and a compensating circuit, the amplifier arrangement operable to receive an input signal and operable to provide an output signal; the method comprising the steps of tapping a portion of the input signal using an input tap, tapping a portion of a signal output from said amplifier to derive a feedback signal using an output tap; delaying said tapped input signal using delay means; deriving a phase error signal responsive to the phase component of the delayed tapped input signal and the phase component of the feedback signal using phase processing means, and; deriving an amplitude error signal responsive to the amplitude component of the delayed tapped input signal and the amplitude component of the feedback signal using amplitude processing means; combining the phase error signal and the amplitude error signal with the input signal using mixer means to prior to signal amplification.

In accordance with a fifth aspect of the invention, there is provided a method of operating a linear power amplifier comprising a power amplifier, a feedback circuit and a control element; the method comprising the providing a sample of the input signal delayed in time to the feedback circuit; providing a sample of the output signal by means of the feedback circuit; splitting both samples into phase and amplitude components; deriving phase and amplitude control signals from these respective phase and amplitude signals; and mixing these control signals with an input to the power amplifier; whereby the power amplifier can produce a linear output.

In accordance with a sixth aspect of the invention, there is provided a method of amplifying a signal comprising the steps of: amplifying an input signal in an amplifier, obtaining a portion of an input signal to said amplifier by means of an input tap on an input line to said amplifier, delaying said portion is by a delay element and splitting the signal portion into phase and amplitude components; tapping off a feedback signal using an output tap on an output line from said amplifier to obtain a portion of the output signal and splitting the feedback signal into phase and amplitude components; combining the delayed input signal phase component with the feedback phase component by the phase control circuit to produce a phase correction signal which is multiplied with a first multiplier, and; combining the delayed input signal amplitude component with the feedback amplitude component by the amplitude control circuit to produce an amplitude correction signal which is multiplied with a second multiplier; which phase and amplitude correction signals are added to the input line to said amplifier whereby, in operation, the amplifier output signal is a substantially linear replica of the input signal.

BRIEF DESCRIPTION OF THE DRAWINGS

In order that the present invention can be more fully understood and to show how the same may be carried into effect, reference shall now be made, by way of example only, to the figures as shown in the accompanying drawing sheets wherein.

DETAILED DESCRIPTION OF THE PREFERRED EMBODIMENTS

There will now be described by way of example the best mode contemplated by the inventors for carrying out the invention. In the following description, numerous specific details are set out in order to provide a complete understanding of the present invention. It will be apparent, however, to those skilled in the art that the present invention may be put into practice with variations of the specific.

Figure 1:
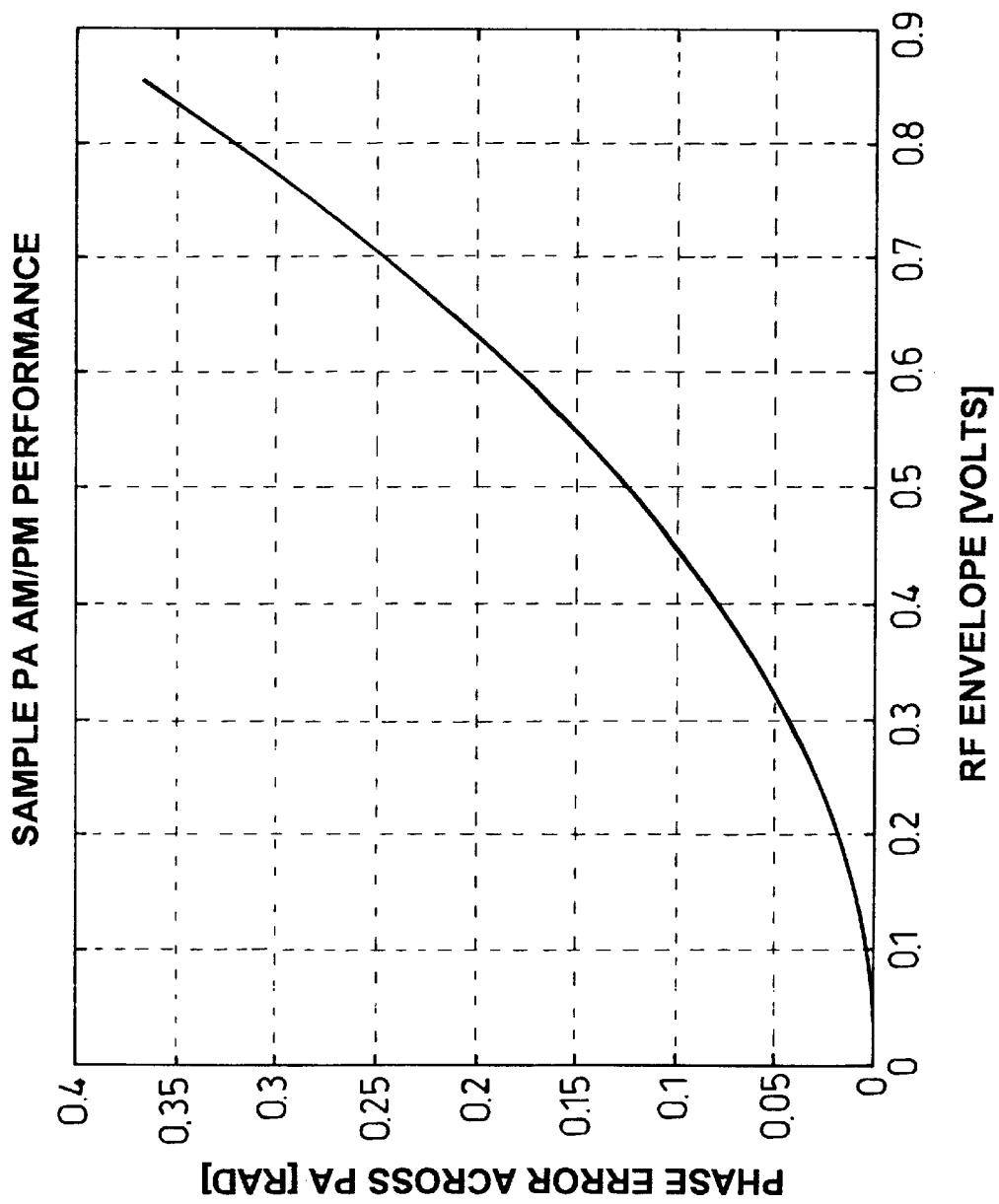
FIG. 1 is a graph depicting a typical amplifier non-linearity.
Figure 2:
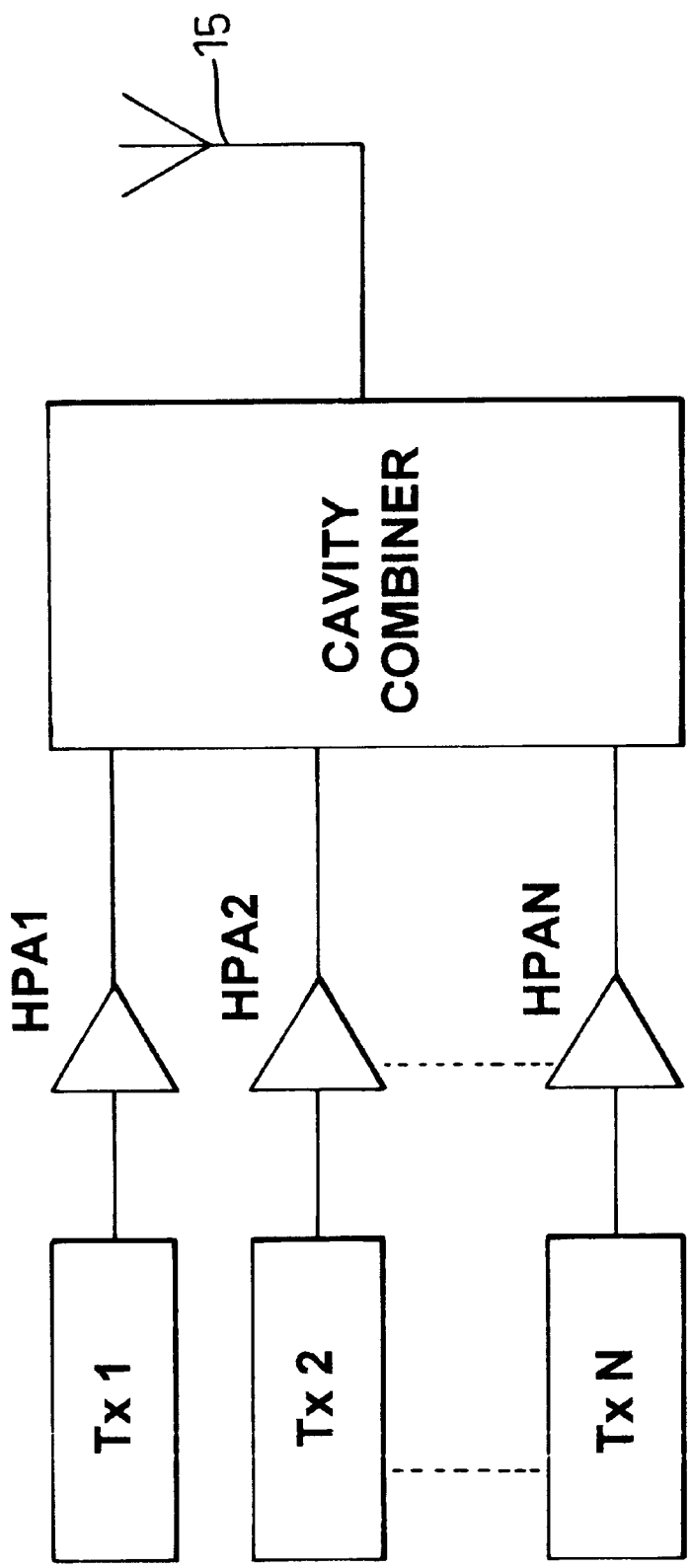
FIG. 2 shows a first known amplifier arrangement.

FIG. 1 shows for a typical amplifier a plot of phase rotation versus envelope voltage, which could be provided by, for example, an amplifier as shown in FIG. 2. The effective phase length of the amplifier varies with respect to the RF envelope voltage. FIG. 2 shows a conventional cavity combiner transmitter system. A plurality of separate transmitters TX1, TX2 . . . TXM each generate a signal which occupies a particular radio frequency band which is then amplified by respective high power amplifier HPA1, HPA2, . . . HPAN. The set of N such amplified signals are combined by a cavity combiner 10 for feeding to an antenna 15.

Figure 3:
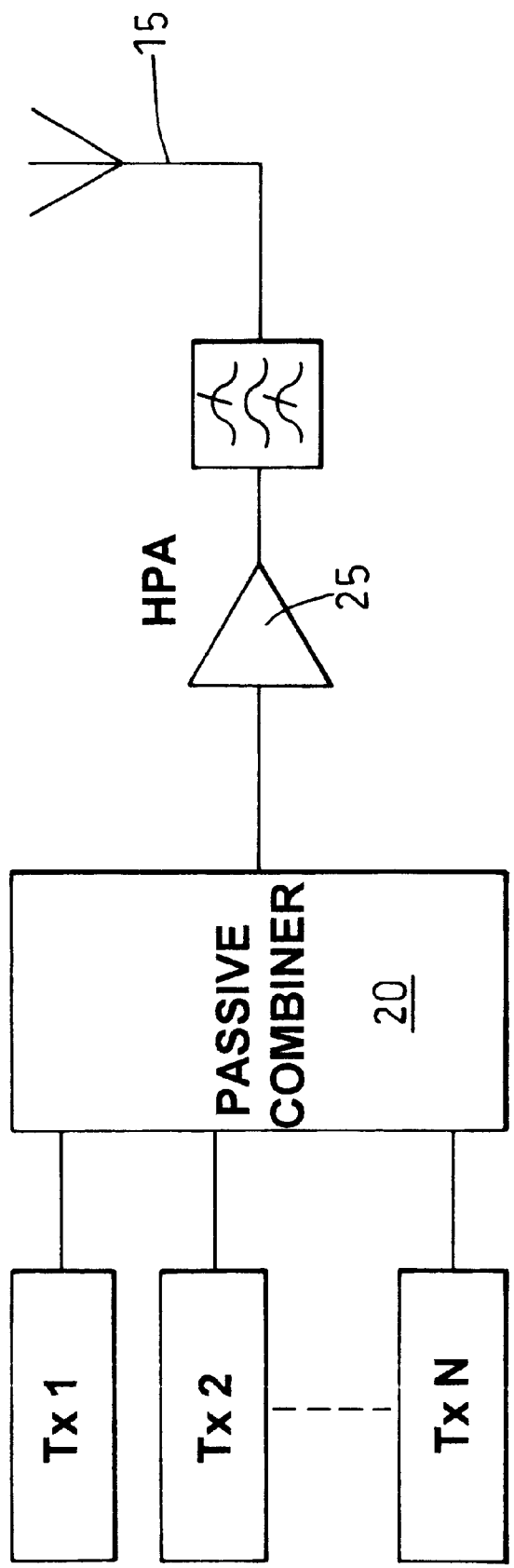
FIG. 3 shows a second known amplifier arrangement.

FIG. 3 shows a further known method of achieving multiple radio frequency carrier amplification. A plurality of transmitters TX1, TX2 . . . TXN each generate a signal which occupies a particular radio frequency band. The set of end such signals are combined by a passive combiner 20, amplified by high power amplifier HPA25 and fed to an antenna 15. HPA25 requires a linear amplitude/phase characteristic over a wide bandwidth. An advantage of this arrangement is that a single amplifier 25 is used, compared with a set of N amplifiers (HPA1, HPA2, . . . HPAN) used in the arrangement FIG. 2. Accordingly it can be more cost effective to use this second arrangement.

Some known high power amplifier sub-systems employ control elements fed by a control signal derived by a phase comparator. The phase comparator compares the phase of an input signal entering the HPA sub-system With the phase of a signal tapped from an output of the HPA. The performance of a linear amplifier tends to be limited by the performance of the phase comparator and a delay through the amplifier. This type of system has been used with limited success.

Figure 4:
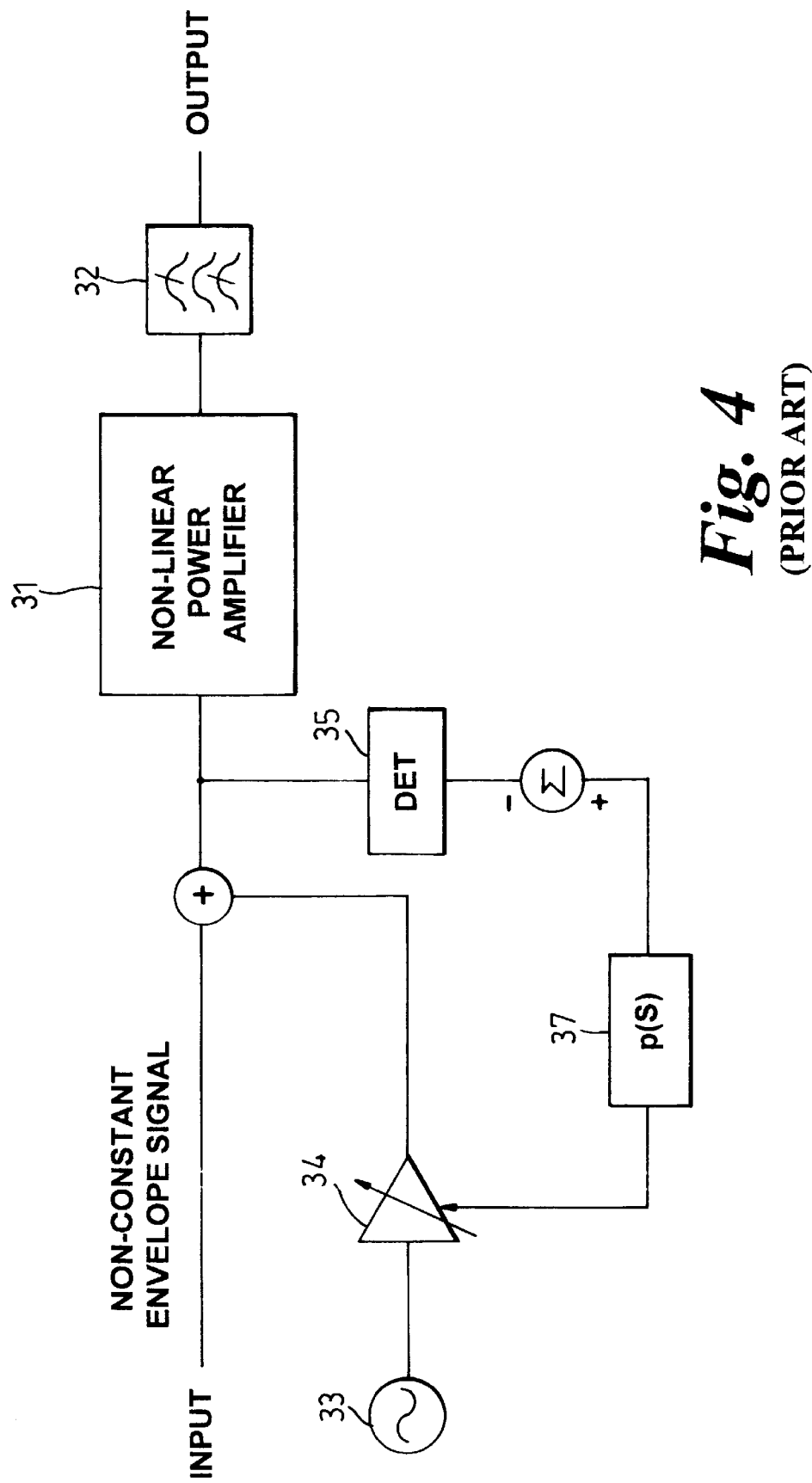
FIG. 4 shows a prior art out of band compensation device.
Figure 5:
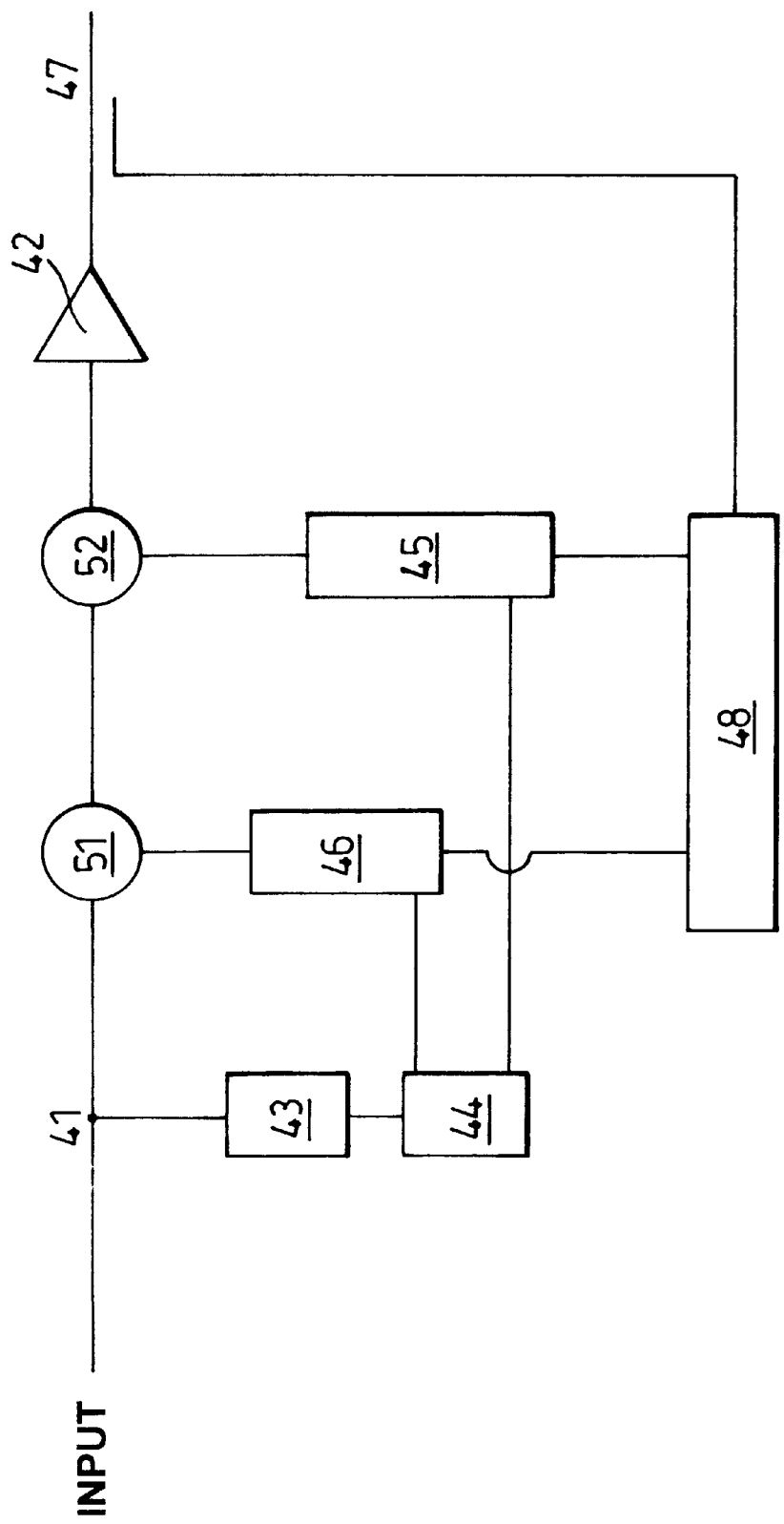
FIG. 5 shows a first embodiment of the invention.

FIG. 4 shows an example of an amplifier arrangement as proposed by Qualcomm in WO 97/24798. A non-constant envelope input signal is fed to a summer 30 prior to being input to a non-linear power amplifier 31. Output O/P signals are filtered by a band-pass filter 32 . The system adds an out of band signal, provided by oscillator 33, to the input signal to produce a combined signal which has a power that is substantially equal to a nominal operating point for the non-linear amplifier 31. It is preferred that the instantaneous power is variable by means of an automatic gain amplifier, which receives a control signal from a signal summed from a sample of the summed input signal Referring now to FIG. 5, there is shown an amplifier sub-system made in accordance with the invention. The amplifier sub-system 40 comprises an input line I/P which feeds a high power amplifier 42. A feedback arrangement receives a feedback signal from output tap 47. A signal tapped from the input line at input tap 41 feeds a delay element 43 which feeds a signal splitter 44. Signal splitter 44 splits the signal into phase components and amplitude components which are fed into respective phase and amplitude control blocks, 45, 46. Device 48 represents a phase and amplitude splitter for the feedback signals received from the coupler 47 and these signals are also fed into the respective phase and amplitude. control blocks, 45, 46. The phase and amplitude blocks, 45, 46 provide respective phase and amplitude control signals to phase and amplitude control mixer (multiplier) elements 52 and 51 on the input line, prior to amplification by the high power amplifier 42.

Figure 6:
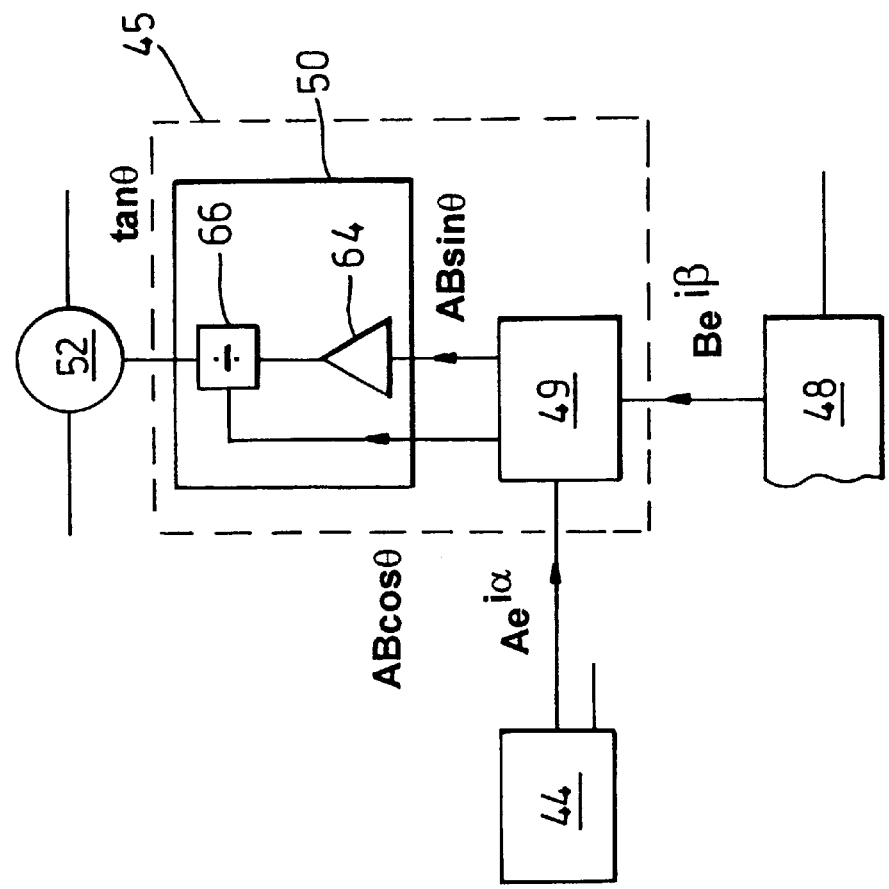
FIG. 6 shows in detail the phase control block of the embodiment shown in FIG. 5.

The phase control block (circuit) is shown in FIG. 6 and comprises a phase comparator 49 and a phase control device 50 which, in turn, drives the phase control mixer element 52. The phase comparator receives a first input signal $A\exp(i\alpha)$, from the time delayed input, at a first input and receives a second input signal $B\exp(i\beta)$, the phase component of the feedback sampled output, from element 48 at a second input. These inputs correspond to the phases of the input and output signals to the arrangement. The output signals from this phase comparator are AB cos υ and AB sin υ (υ=α−β) The AB sin υ signal is amplified and then fed to a divider which receives an AB cos υ control signal from the phase comparator. The output from the divider, tan υ, is passed to phase control mixer element 52.

Figure 7:
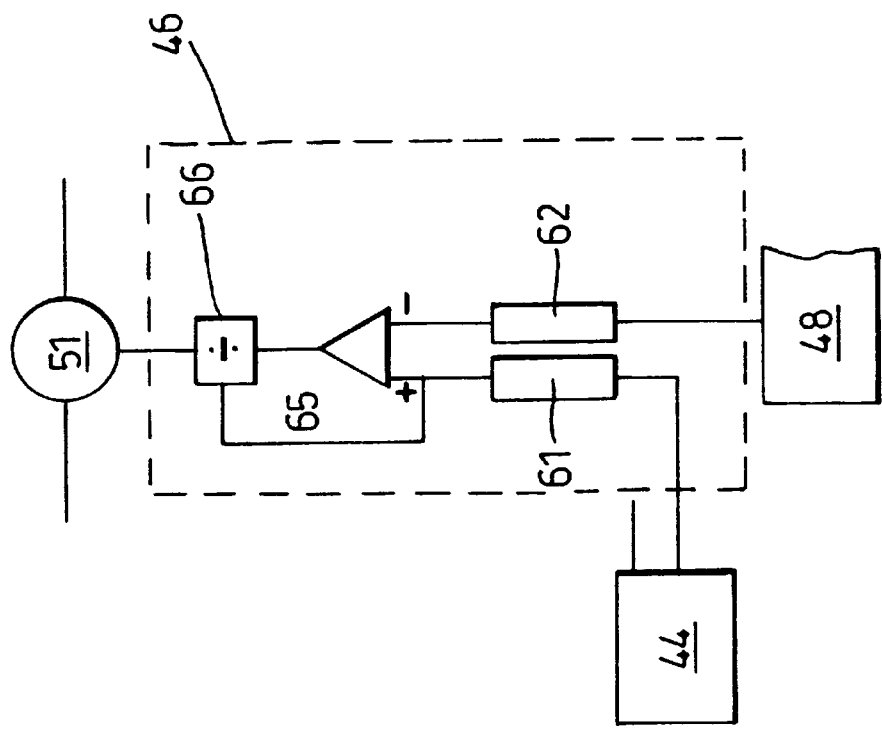
FIG. 7 shows in detail the amplitude control block of the embodiment shown in FIG. 5.

Considering the amplitude control block (circuit), shown in FIG. 7, there is provided an amplitude comparator block, which is equivalent to two envelope detectors—an envelope detector 61, 62 for each input, receiving amplitude signals, respectively, from the time delayed input and the feedback sampled output. The signals output from the envelope detectors 61, 62 are input to, respectively, the positive and negative inputs of an operational-amplifier 64 running in differential mode, which provides an amplitude dependent error signal. A control voltage signal coming via control voltage line 65, determined from the output of envelope detector 61 (the input envelope detector), is employed by divider 66 to divide the output of the operational amplifier. The divider essentially comprises an attenuator, such as a variable attenuator, and the divided output of the operational amplifier drives the amplitude control mixer element 51. Effectively, the input to the op-amp 64 comes round and acts as the control voltage and the signal modified by the divider 66 is passed to the control element.

This arrangement provides a clear separation of the respective phase and amplitude contributions whereby the separate phase and amplitude contributions respectively determine the phase and amplitude control mixer elements, 51, 52 and there should not be any contamination of amplitude on the phase or phase on the amplitude using this technique. The amplifiers employed in the phase and amplitude blocks can be of amplifier class a/b: i.e. the high power amplifiers need not be particularly linear, and overall efficiencies can be of the order of 15–18%, for the 1800–1900 Hz range.

In a further embodiment, the signals fed to phase and amplitude control elements 52, 51 could be employed to drive a single vector control element. Alternatively, the position of the phase and amplitude elements may be interchanged.

Figure 8:
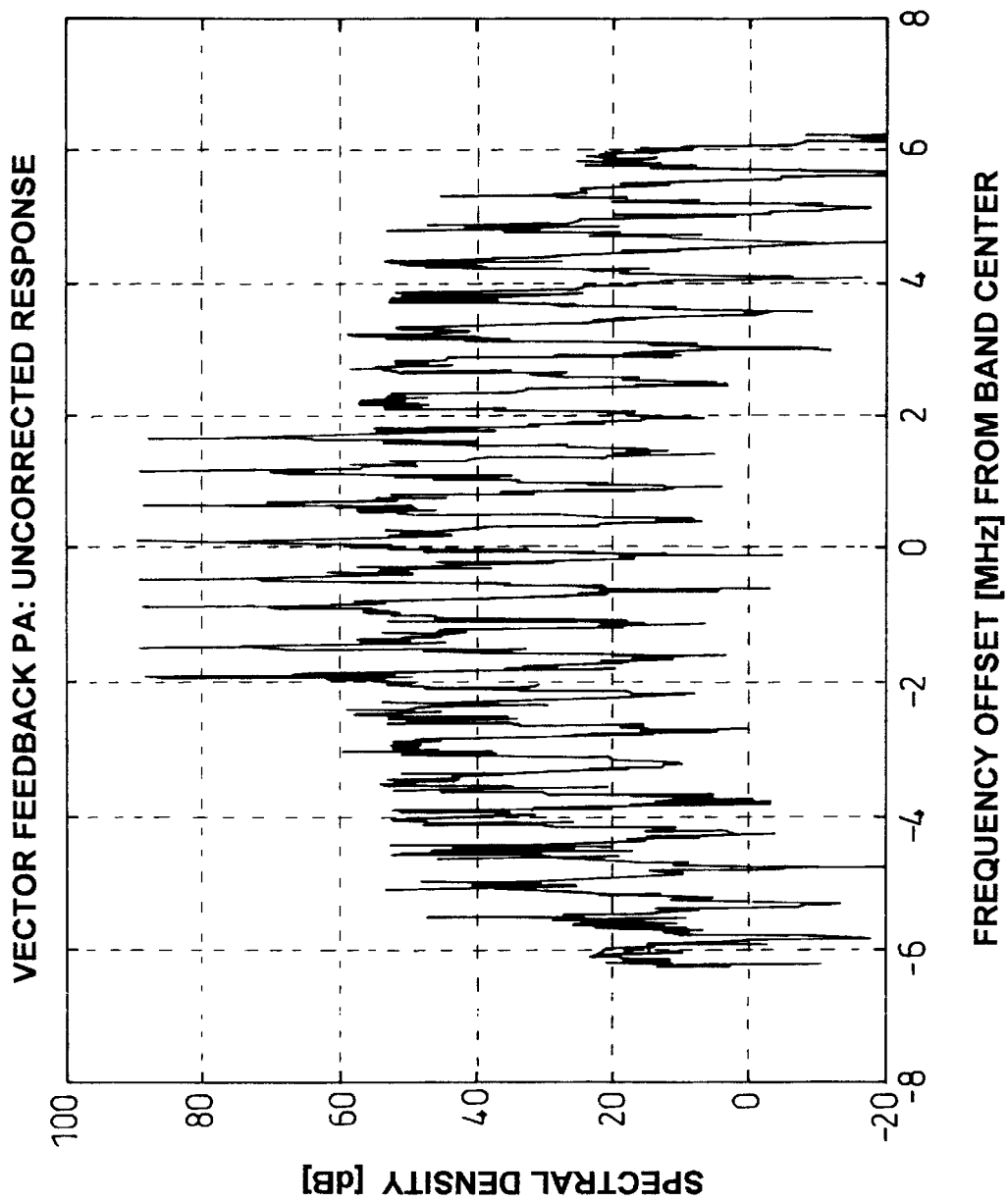
FIGS. 8 and 9 shows, respectively, non-linearized and linearized spectral emission graphs.
Figure 9:
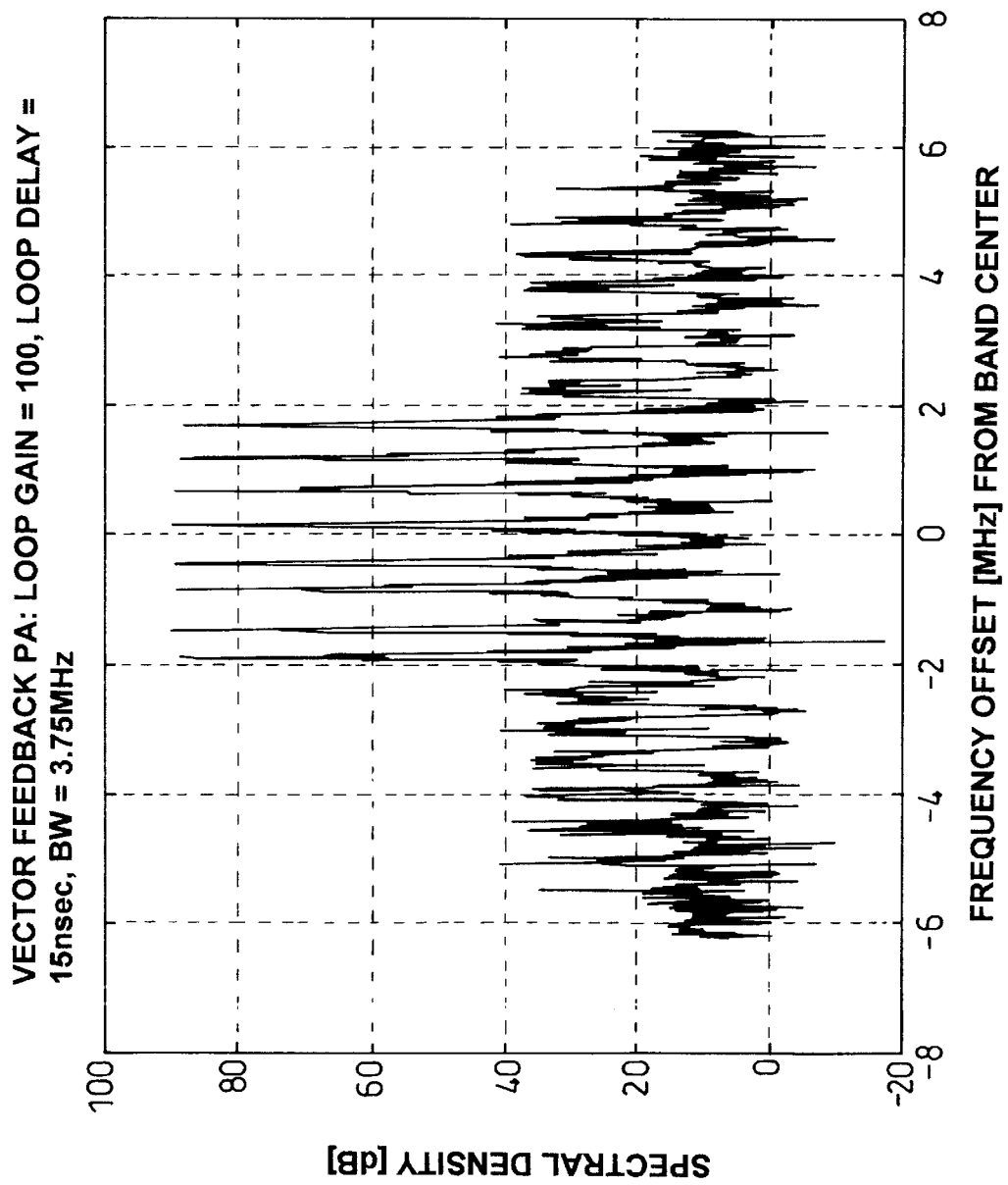

FIG. 8 is a graph depicting the spectral emission of a non-linear amplifier having the phase rotation v amplitude voltage variance as depicted in FIG. 1: the wanted frequency band is not sharply defined. In contrast, FIG. 9 shows a plot of a simulation of an amplifier made in accordance with the present invention, providing improved spectral emissions. The loop delay is typically 15 nsec, with a gain of 100 Volts per Volt (40 dB).

Previous designs for providing amplification have, for example, three amplifiers and a combiner. Benefits of the present invention are primarily of size and cost savings: board space and the total number of piece parts, amongst other characteristics and/or requirements are reduced relative to prior art multi-carrier power amplifiers using dual loop feed forward technology with typical efficiencies of around 4 and half percent when operating on IS95 type signals, irrespective of number of IS 95 bearers. Typically, the present invention will provide an amplifier that is half the cost yet twice the efficiency of prior art amplifiers.

What is claimed is:

1. A linear power amplifier arrangement comprising an input line, a power amplifier, an output line, an input tap and an output tap, first and second mixers, and a feedback circuit comprising a delay element, a first splitter, a second splitter, a phase control circuit and an amplitude control circuit,;

wherein the first and second mixers are placed on the input line between the input tap and the power amplifier;

wherein the phase control circuit comprises a phase comparator, a phase control amplifier and a divider;

wherein the phase comparator is arranged to receive delayed phase signals from the input, Aexp(iα), and the feedback signal, Bexp(iβ), and is arranged to provide output signals AB sin Θ and signal AB cos Θ (where Θ=α−β);

wherein the phase control amplifier is arranged to receive the signal AB sin Θ from the amplitude comparator which is arranged to output a signal to the divider, and;

wherein the divider is arranged to receive a control signal corresponding to signal AB cos Θ and is arranged to provide a phase error signal, tan Θ, to be multiplied by the first phase correcting mixer;

wherein in use:
the input tap obtains a portion of the input signal, which portion is delayed by the delay element and split into phase and amplitude components;
the output tap obtains a portion of the output signal from the high power amplifier as part of the feedback circuit which signal is split into phase and amplitude components; and
wherein the delayed input signal amplitude component is combined with the feedback amplitude component by the amplitude control circuit to produce an amplitude correction signal which is mixed with by the second, amplitude correcting, mixer.

2. A linear amplifier arrangement according to claim 1 wherein the amplitude control element comprises an amplitude comparator an operational-amplifier running in differential mode and a divider;

wherein the amplitude comparator comprises two envelope detectors arranged, respectively, to receive amplitude signals from the time delayed input and the feedback, which comparator provides an amplitude dependent error signal;

wherein the operational amplifier is arranged to receive signals from the amplitude comparator at its positive and negative inputs output from the input and feedback envelope detectors of the amplitude comparator respectively, which amplifier outputs to a divider, and;

wherein the divider receives a control voltage signal derived from the input signal envelope detector, whereby the divider is arranged to provide an amplitude error signal to be multiplied by the amplitude correcting mixer.

3. A linear amplifier arrangement according to claim 1 wherein the divider comprises an attenuator.

4. A linear amplifier arrangement according to claim 1 wherein the divider comprises a variable attenuator.

5. A linear power amplifier arrangement comprising a power amplifier and a compensating circuit, the amplifier arrangement operable to receive an input signal and operable to provide an output signal; the compensating circuit comprising:

an input tap for tapping a portion of the input signal;

an output tap for tapping a portion of a signal output from said amplifier to derive a feedback signal;

delay means for delaying said tapped input signal;

phase processing means comprising a phase comparator, an amplifier and a divider, operable to derive a phase error signal responsive to the phase component of the delayed tapped input signal and the phase component of the feedback signal, and;

amplitude processing means operable to derive an amplitude error signal responsive to the amplitude component of the delayed tapped input signal and the amplitude component of the feedback signal;

mixer means comprising a phase error mixer means and an amplitude error mixer, to combine the phase error signal and the amplitude error signal with the input signal prior to signal amplification;

wherein the phase comparator is arranged to receive delayed phase signals from the input, Aexp(iα), and the feedback signal, Bexp(iβ), is arranged to provide output signals AB sin Θ and signal AB cos Θ (where Θ=α-β);

wherein the amplifier is arranged to receive the signal AB sin Θ from the amplitude comparator which is arranged to output a signal to the divider, and;

wherein the divider is arranged to receive a control signal corresponding to signal AB cos Θ and is arranged to provide a phase error signal, tan Θ, to be mixed by the phase correcting mixer means.

6. A linear power amplifier arrangement comprising a power amplifier and a compensating circuit, the amplifier arrangement operable to receive an input signal and operable to provide an output signal; the compensating circuit comprising:

an input tap for tapping a portion of the input signal;

an output tap for tapping a portion of a signal output from said amplifier to derive a feedback signal;

delay means for delaying said tapped input signal;

phase processing means operable to derive a phase error signal responsive to the phase component of the delayed tapped input signal and the phase component of the feedback signal, and;

amplitude processing means operable to derive an amplitude error signal responsive to the amplitude component of the delayed tapped input signal and the amplitude component of the feedback signal;

mixer means to combine the phase error signal and the amplitude error signal with the input signal prior to signal amplification;

wherein the amplitude control circuit comprises an amplitude comparator an operational-amplifier running in differential mode and a divider;

wherein the amplitude comparator comprises two envelope detectors arranged, respectively, to receive amplitude signals from the time delayed input and the feedback which comparator provides an amplitude dependent error signal;

wherein the operational amplifier is arranged to receive signals from the amplitude comparator at its positive and negative inputs output from the input and feedback envelope detectors of the amplitude comparator respectively, which amplifier outputs to a divider, and;

wherein the divider receives a control voltage signal derived from the input signal envelope detector, whereby the divider is arranged to provide an amplitude error signal to be mixed by the amplitude correcting mixer means.

7. A linear power amplifier comprising a power amplifier, a feed forward circuit, a feedback circuit and a control element;

wherein the feedback circuit receives a sample of the input signal delayed in time and employs phase and amplitude components of both the input signal delayed in time and a feedback signal derived from the output of the power amplifier to drive a control element, which control element provides phase and amplitude feedback signal components to the signal input to the amplifier;

wherein the control element includes a phase control circuit which comprises wherein the phase comparator is arranged to receive delayed phase signals from the input, Aexp(iα), and the feedback signal, Bexp(iβ), and is arranged to provide output signals AB sin Θ and signal AB cos Θ (where Θ=α-β);

wherein the phase control amplifier is arranged to receive the signal AB sin Θ from the amplitude comparator which is arranged to output a signal to the divider, and;

wherein the divider is arranged to receive a control signal corresponding to signal AB cos Θ and is arranged to provide a phase error signal, tan Θ, to be multiplied by the first phase correcting mixer.

8. A method of operating a linear power amplifier arrangement comprising an input line, a power amplifier, an output line, an input tap and an output tap, first and second mixers, and a feedback circuit comprising a delay element, a first splitter, a second splitter, a phase control circuit and an amplitude control circuit, the method comprising the steps of:

obtaining a portion of the input signal by means of the input tap, delaying said portion is by a delay element and splitting the signal portion into phase and amplitude components;

tapping off a feedback signal using the output tap to obtain a portion of the output signal from the high power amplifier and splitting the feedback signal into phase and amplitude components;

combining the delayed input signal phase component with the feedback phase component by the phase control circuit to produce a phase correction signal which is mixed with the first mixer, and;

combining the delayed input signal amplitude component with the feedback amplitude component by the amplitude control circuit to produce an amplitude correction signal which is mixed with the second mixer;

whereby, in operation, the amplifier has a linear output signal.

9. A method of operating a linear power amplifier arrangement comprising an input line, a power amplifier, an output line, an input tap and an output tap, first and second mixers, and a feedback circuit comprising a delay element, a first splitter, a second splitter, a phase control circuit and an amplitude control circuit, and wherein the amplitude control circuit comprises an amplitude comparator an operational-amplifier running in differential mode and a divider;

wherein the amplitude comparator comprises two envelope detectors arranged, respectively, to receive amplitude signals from the time delayed input and the feedback which comparator provides an amplitude dependent error signal;

wherein the operational amplifier is arranged to receive signals from the amplitude comparator at its positive and negative inputs output from the input and feedback envelope detectors of the amplitude comparator respectively, which amplifier outputs to a divider, and;

wherein the divider receives a control voltage signal derived from the input signal envelope detector, whereby the divider is arranged to provide an amplitude error signal to be mixed by the amplitude correcting mixer;

the method comprising the steps of:
obtaining a portion of the input signal by means of the input tap, delaying said portion is by a delay element and splitting the signal portion into phase and amplitude components;
tapping off a feedback signal using the output tap to obtain a portion of the output signal from the high power amplifier and splitting the feedback signal into phase and amplitude components;
combining the delayed input signal phase component with the feedback phase component by the phase control circuit to produce a phase correction signal which is mixed with the first mixer, and;
combining the delayed input signal amplitude component with the feedback amplitude component by the amplitude control circuit to produce an amplitude correction signal which is mixed with the second mixer;
whereby, in operation, the amplifier has a linear output signal.

10. A method of operating a linear power amplifier arrangement comprising a power amplifier and a compensating circuit, the amplifier arrangement operable to receive an input signal and operable to provide an output signal wherein the compensating circuit includes a phase control circuit;
wherein the phase control circuit comprises a phase comparator, a phase control amplifier and a divider;
wherein the phase comparator is arranged to receive delayed phase signals from the input, $A\exp(i\alpha)$, and the feedback signal, $B\exp(i\beta)$, and is arranged to provide output signal $AB \sin \Theta$ and signal $AB \cos \Theta$ (where $\Theta=\alpha-\beta$);
wherein the phase control amplifier is arranged to receive the signal $AB \sin \Theta$ from the amplitude comparator which is arranged to output a signal to the divider, and;
wherein the divider is arranged to receive a control signal corresponding to signal $AB \cos \Theta$ and is arranged to provide a phase error signal, $\tan \Theta$, to be mixed by the first, phase correcting, mixer,
the method comprising the following steps:
tapping a portion of the input signal using an input tap,
tapping a portion of a signal output from said amplifier to derive a feedback signal using an output tap;
delaying said tapped input signal using delay means;
deriving a phase error signal, $\tan \theta$, responsive to the phase component of the delayed tapped input signal and the phase component of the feedback signal using phase processing means;
deriving an amplitude error signal responsive to the amplitude component of the delayed tapped input signal and the amplitude component of the feedback signal using amplitude processing means; and
combining the phase error signal and the amplitude error signal with the input signal using mixer means to prior to signal amplification.

11. A method of operating a linear power amplifier comprising a power amplifier, a feedback circuit and a control element; wherein the feedback circuit receives a sample of the input signal delayed in time and employs phase and amplitude components of both the input signal delayed in time and a feedback signal derived from the output of the power amplifier to drive a control element, which control element provides phase and amplitude feedback signal components to the signal input to the amplifier;
wherein the control element includes a phase control circuit which comprises wherein the phase comparator is arranged to receive delayed phase signals from the input, $A\exp(i\alpha)$, and the feedback signal, $B\exp(i\beta)$, and is arranged to provide output signals $AB \sin \Theta$ and signal $AB \cos \Theta$ (where $\Theta=\alpha-\beta$);
wherein the phase control amplifier is arranged to receive the signal $AB \sin \Theta$ from the amplitude comparator which is arranged to output a signal to the divider, and;
wherein the divider is arranged to receive a control signal corresponding to signal $AB \cos \Theta$ and is arranged to provide a phase error signal, $\tan \Theta$, to be multiplied by the first phase correcting mixer;
the method comprising the
providing a sample of the input signal delayed in time to the feedback circuit;
providing a sample of the output signal by means of the feedback circuit;
splitting both samples into phase and amplitude components; and
deriving phase and amplitude control signals from these respective phase and amplitude signals; and mixing these control signals with an input to the power.

12. A method of amplifying a signal comprising the steps of:
amplifying an input signal in an amplifier,
obtaining a portion of an input signal to said amplifier by means of an input tap on an input line to said amplifier, delaying said portion by a delay element and splitting the signal portion into phase and amplitude components;
tapping off a feedback signal using an output tap on an output line from said amplifier to obtain a portion of the output signal and splitting the feedback signal into phase and amplitude components;
combining the delayed input signal phase component with the feedback phase component by the phase control circuit to produce a phase correction signal which is mixed by a first mixer, and;
combining the delayed input signal amplitude component with the feedback amplitude component by the amplitude control circuit to produce an amplitude correction signal which is mixed with a second mixer;
which phase and amplitude correction signals are added to the input line to said amplifier whereby, in operation, the amplifier output signal is a substantially linear replica of the input signal;
wherein the phase control circuit comprises a phase comparator, an amplifier and a divider;
wherein the phase comparator is arranged to receive delayed phase signals from the input, $A\exp(i\alpha)$, and the feedback signal, $B\exp(i\beta)$, and is arranged to provide output signal $AB \sin \Theta$ and signal $AB \cos \Theta$ (where $\Theta=\alpha-\beta$);
wherein the amplifier is arranged to receive the signal $AB \sin \Theta$ from the amplitude comparator which is arranged to output a signal to the divider, and;
wherein the divider is arranged to receive a control signal corresponding to signal $AB \cos \Theta$, and is arranged to provide a phase error signal, $\tan \Theta$, to be multiplied by the phase correcting multiplier.

13. A method of amplifying a signal comprising the steps of:
amplifying an input signal in an amplifier,
obtaining a portion of an input signal to said amplifier by means of an input tap on an input line to said amplifier, delaying said portion by a delay element and splitting the signal portion into Phase and amplitude components;

tapping off a feedback signal using an output tap on an output line from said amplifier to obtain a portion of the output signal and splitting the feedback signal into phase and amplitude components;

combining the delayed input signal phase component with the feedback phase component by the phase control circuit to produce a phase correction signal which is mixed by a first mixer, and;

combining the delayed input signal amplitude component with the feedback amplitude component by the amplitude control circuit to produce an amplitude correction signal which is mixed by a second mixer;

which phase and amplitude correction signals are added to the input line to said amplifier whereby, in operation, the amplifier output signal is a substantially linear replica of the input signal;

wherein the amplitude control circuit comprises an amplitude comparator an operational-amplifier running in differential mode and a divider;

wherein the amplitude comparator comprises two envelope detectors arranged, respectively, to receive amplitude signals from the time delayed input and the feedback which comparator provides an amplitude dependent error signal;

wherein the operational amplifier is arranged to receive signals from the amplitude comparator at its positive and negative inputs output from the input and feedback envelope detectors of the amplitude comparator respectively, which amplifier outputs to a divider; and wherein the divider receives a control voltage signal derived from the input signal envelope detector, whereby the divider is arranged to provide an amplitude error signal to be multiplied by the amplitude correcting mixer.

* * * * *